United States Patent
Ahnert et al.

(10) Patent No.: US 8,661,661 B2
(45) Date of Patent: Mar. 4, 2014

(54) PROCESS FOR THE PRODUCTION OF A CIRCUIT PORTION ON A SUBSTRATE

(76) Inventors: Axel Ahnert, Ismaning (DE); Elmar Grandy, Oberschleissheim (DE)

( * ) Notice: Subject to any disclaimer, the term of this patent is extended or adjusted under 35 U.S.C. 154(b) by 1006 days.

(21) Appl. No.: 12/305,839

(22) PCT Filed: Jun. 21, 2007

(86) PCT No.: PCT/EP2007/005489
§ 371 (c)(1),
(2), (4) Date: Feb. 24, 2009

(87) PCT Pub. No.: WO2007/147602
PCT Pub. Date: Dec. 27, 2007

(65) Prior Publication Data
US 2009/0205204 A1    Aug. 20, 2009

(30) Foreign Application Priority Data
Jun. 21, 2006    (DE) .................. 10 2006 028 536

(51) Int. Cl.
*H05K 3/02* (2006.01)
*H05K 3/10* (2006.01)
*H01K 3/00* (2006.01)

(52) U.S. Cl.
USPC .................. 29/846; 29/847; 29/849

(58) Field of Classification Search
USPC ........ 29/846, 825, 847, 849; 174/250; 427/98
See application file for complete search history.

(56) References Cited

U.S. PATENT DOCUMENTS

| | | | |
|---|---|---|---|
| 4,121,007 A * | 10/1978 | Kobayashi et al. | 428/201 |
| 4,444,848 A * | 4/1984 | Shanefield et al. | 428/624 |
| 4,582,564 A * | 4/1986 | Shanefield et al. | 216/18 |
| 5,544,773 A * | 8/1996 | Haruta et al. | 216/13 |
| 5,633,069 A * | 5/1997 | Shimizu et al. | 428/192 |
| 5,639,556 A * | 6/1997 | Gaumet | 428/568 |
| 5,733,639 A * | 3/1998 | Gosselin | 428/209 |
| 6,405,431 B1 * | 6/2002 | Shin et al. | 29/852 |
| 6,555,015 B1 * | 4/2003 | Dailey et al. | 216/17 |
| 7,183,189 B2 * | 2/2007 | Hashimoto | 438/612 |
| 7,317,621 B2 * | 1/2008 | Kimura et al. | 361/760 |
| 7,361,927 B2 * | 4/2008 | Kawase et al. | 257/40 |
| 2010/0092659 A1 * | 4/2010 | Maaninen et al. | 427/124 |

FOREIGN PATENT DOCUMENTS

| | | |
|---|---|---|
| DE | 29905472 U1 | 7/1999 |
| DE | 19942054 A1 | 12/2001 |
| EP | 0414363 A2 | 2/1991 |
| EP | 1 841 301 A2 | 10/2007 |

(Continued)

OTHER PUBLICATIONS

Amended Claims as filed with the European Patent Office for counterpart European Application No. 077261119.6, Apr. 6, 2011.

(Continued)

*Primary Examiner* — David Angwin
(74) *Attorney, Agent, or Firm* — Sughrue Mion, PLLC

(57) ABSTRACT

The invention relates to a method for producing at least one circuit part on a substrate (20). Said method comprises the following steps: at least one granulate (54), which contains an electric conductor and which has a predefined geometric distribution, is deposited on the substrate (20) and the granulate (54) is heated and forms a permanent connection with the substrate (20) and forms at least one circuit part on the substrate (20). The invention also relates to a circuit board comprising at least one substrate, on which at least one circuit part is arranged, and to a device for producing at least one circuit part on a substrate (20).

11 Claims, 2 Drawing Sheets

(56) References Cited

FOREIGN PATENT DOCUMENTS

Figure 1:
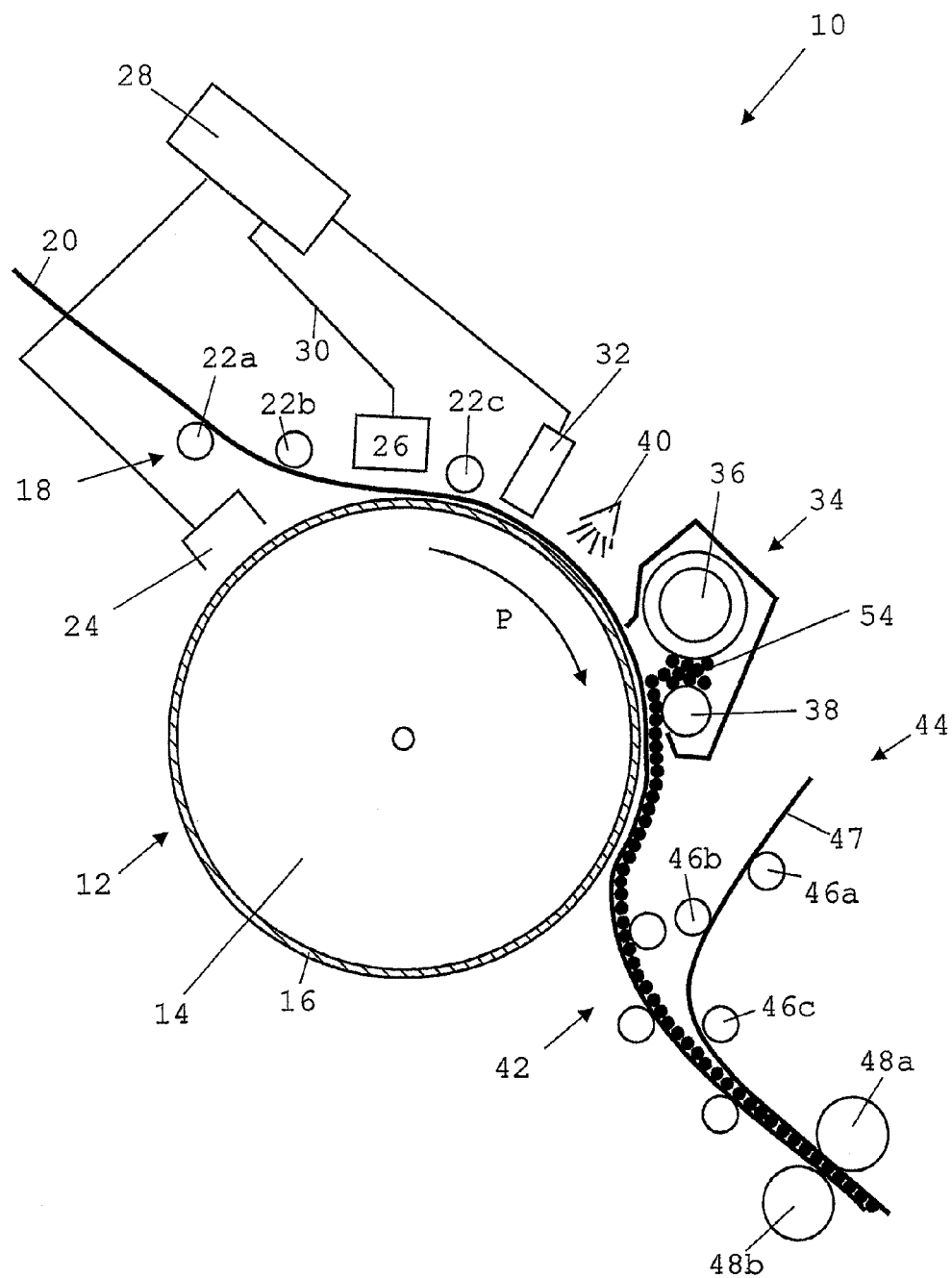

| | | |
|---|---|---|
| FR | 2 321 817 A1 | 3/1977 |
| GB | 854449 A | 11/1960 |
| JP | 07-006640 A | 1/1995 |
| JP | 2002-151828 A | 5/2002 |
| WO | 92/20489 A1 | 11/1992 |
| WO | 03/032084 A2 | 4/2003 |
| WO | 2006/112101 A1 | 10/2006 |
| WO | 2006/133761 A2 | 12/2006 |

OTHER PUBLICATIONS

Examination Report issued by the European Patent Office on Sep. 2, 2010 for counterpart European Application No. 07726119.6.

Examination Report issued by the German Patent Office on Apr. 6, 2011 for counterpart German Application No. 102006028536.0-34.

* cited by examiner

PROCESS FOR THE PRODUCTION OF A CIRCUIT PORTION ON A SUBSTRATE

The invention concerns a process for the production of at least one circuit portion on a substrate. In accordance with further aspects the invention concerns a circuit board having at least one circuit portion, a composite component with a plurality of circuit boards and an apparatus for carrying out said process.

Generally known processes for the production of conductor tracks of a predetermined conductor track structure on a substrate are based for example on wet chemical-photolithographic or mechanical processing of copper-plated base material which is possibly light-sensitive on one side and which is made for example from hard paper or epoxy resin.

A disadvantage with the photolithographic process is that numerous different process steps are required and, in individual production, in particular due to the etching process, inaccuracies in the conductor track structure can occur. Thus depending on the etching time the conductor tracks can be attacked at the edges. The etching-induced inaccuracies mean that the minimum width of a conductor track is limited in a downward direction and a minimum spacing of the tracks from each other is necessary. Unwanted inaccuracies also occur in mechanical processing, for example by milling of the base material. The structuring accuracy which is limited with the conventional procedures represents a problem especially in the production of multilayer circuit boards (multilayers) as in that case the individual conductor track structures must be afforded in mutually superposed layered relationship as exactly as possible. Furthermore another disadvantage of the photolithographic process is that wet chemical steps are required. They give rise to residual substances which have to be disposed of, and that is expensive and causes environmental pollution.

The object of the invention is to provide an improved process for the production of at least one circuit portion on a substrate, with which the disadvantages of the conventional procedures are reduced or overcome. Another object of the invention is to provide an improved circuit board having at least one circuit portion.

The object of the invention is attained by a process, a circuit board, a composite component or a production apparatus as described herein.

In accordance with a first aspect the invention attains that object by a process comprising the steps of depositing at least one electrically conductive granular material on a substrate and heating the granular material in such a way that the granular material involves a permanent join to the substrate and forms at least one circuit portion on the substrate. The granular material is deposited on the substrate in a predetermined geometrical distribution corresponding to the geometrical shape of the desired circuit portion or constituent parts thereof. Heating of the granular material causes the granular material to melt to itself. Without a change in the geometrical distribution, that affords a melted structure which is joined to the substrate. The substrate comprises an electrically insulating material. Preferably the substrate material used is one which can be softened by heat so that the circuit portion is embedded in the surface of the substrate (melting-in process) and/or which, under the action of pressure and heat, forms an adhesion join to the granular material (application process). In a particularly preferred embodiment the substrate is so designed for the application process that the granular material bonds to the substrate upon contact therewith.

In accordance with a second aspect the invention attains the object by a process for the production of an electrical composite component which is composed of a plurality of substrates carrying at least one circuit portion produced in accordance with the invention.

In accordance with further aspects of the invention the specified object is attained by a circuit board including at least one substrate with at least one circuit portion, the structure of which is formed by a melted granular material, and a composite component having a stack of circuit boards according to the invention.

In accordance with a further aspect the invention attains the specified object by the use of an electrophotographic printing process, in particular the laser printing process, for printing out at least one electrically conducting granular material on an electrically insulating substrate.

In accordance with a further aspect the invention attains the object by an apparatus for the production of a composite comprising a substrate having at least one circuit portion, wherein the apparatus is provided with an electrization element which includes an electrical photoconductor and an electrical conducting element, an electrization apparatus for electrostatic charging of the electrization element, a light source for local selective discharging of the electrization element, a deposition device for applying an electrical conductor (the granular material) and an applicator device for applying an areal substrate to the electrization element.

A substantially advantage of the invention lies in the increased accuracy in terms of positioning and shaping of the at least one circuit portion on the substrate. It is possible to achieve levels of accuracy of far below 1 mm. Accordingly it is possible to implement reduced minimum widths and minimum spacings of circuit portions. A further advantage with the process according to the invention is that only one apparatus has to be provided for the production of the circuit portion. The use of only one apparatus means that the process can also be carried out very rapidly. It is suitable in particular for rapid prototyping, that is to say for the rapid production of circuits on a small-scale series. A further advantage is that it is possible to dispense with wet-chemical processes. Therefore no residual substances which have to be disposed of are produced.

In the present description the term "depositing" a granular material is used to denote generally arranging the granular material, in particular scattering it, applying it by electrostatically unequal charging of granular material and substrate or spraying on the granular material, for example in a paste or slurry. Depositing of the granular material is effected in such a way that a predetermined surface coverage (mass of granular material per unit of surface area) of the substrate is achieved. The surface coverage is preferably so selected that what is referred to as the percolation threshold is exceeded. That condition is satisfied if the surface coverage is sufficiently high so that an electrical current can flow through the granular material deposited on the substrate, as can be established by simple tests with the materials which are specifically used.

The term "granular material" (or: "powder") is used to denote generally a grain mixture which is capable of flow and the grain size and grain shape of which are selected in dependence on the specific use. The granular material includes as the electrically conductive material a conductor such as for example copper, nickel, silver, aluminum, a copper-tin alloy or a conductive plastic material or a semiconductor such as for example doped silicon or an organic semiconductor. The use of the copper-tin alloy has the advantage that the melting point can be adjusted in dependence on the proportion of tin.

In accordance with a first variant the granular material comprises the electrically conductive material. In accordance with a second variant the granular material comprises a composite material in which the individual grains have a core comprising the electrically conductive material and an encapsulation. The encapsulation can comprise an electrically insulating, thermally decomposable material (decomposition temperature preferably below 300° C.) or a further electrically conductive material (for example copper on a core of aluminum). The composite material can be produced by vapor deposition of the encapsulation on the cores, for example by the cores flowing in a cooled condition through a heated mist of the desired encapsulation material.

Typically the grain size of the granular material used according to the invention, that can be measured with per se known methods, can be at a maximum 1 mm, preferably at a maximum 500 cm, particularly preferably a maximum of 300 µm. Typically at least 1 µm, preferably at least 50 µm, particularly preferably at least 100 µm, is selected as the lower limit of the grain size.

The granular material can be heated in particular by being heated together with the substrate. Alternatively the substrate and/or the granular material can be heated by high-frequency electrical alternating fields or by the absorption of light of a suitable wavelength, in particular laser light.

A further important advantage of the invention lies in the variability of the natures of the circuit portions which can be produced on the substrate. Thus in accordance with a preferred embodiment of the invention the material and the geometrical distribution of the deposited granular material can be so selected that the circuit portion forms at least one conductor track on the substrate. Preferably a predetermined conductor structure is formed, as is provided in the production of printed circuits. In a modified embodiment of the invention the material and the geometrical distribution of the deposited granular material can be so selected that the circuit portion forms at least one component of an electrical circuit on the substrate. The component can be an active semiconductor component such as for example a diode or a transistor or a passive component such as for example a resistor. Resistors can be produced for example by the selection of a predetermined material such as for example carbon and/or a predetermined surface coverage of the granular material. Advantageously in accordance with the invention a complete electrical circuit can be produced by a procedure whereby various granular materials are deposited, which after heating form on the substrate circuit portions having at least one conductor track and at least one active or passive component. For that purpose the deposit step is repeated with the various granular materials in substeps. A heating operation for forming the corresponding circuit portions can be provided between the respective substeps. A preferred embodiment of the invention however is one in which the substeps are provided in immediate succession prior to a single heating operation.

In a preferred process a plastic material, in particular a plastic film, is used for the substrate as a non-conductor. Film substrates enjoy particular advantages because they are inexpensive and easy to process. They are also flexible so that it is possible to produce bendable electrical components. Alternatively thin thermosetting tracks or Pertinax plates are used.

In the application process the substrate preferably comprises a single plastic material. The melting-in process preferably uses a film multilayer structure comprising two plastic films, particularly preferably with a thermosetting material as a carrier and a thermoplastic layer as a melting-in layer into which the granular material is melted. The softening temperature of the carrier is preferably lower than that of the melting-in layer.

The film multilayer structure can advantageously be used in such a way that it is brought to a temperature at which the melting-in layer has already reached the softening temperature, but the carrier has not. The granular material is then deposited on the melting-in layer. By virtue of softening thereof, the granular material rapidly enters into an intimate bond with the melting-in layer and adheres thereto. As the carrier has not yet reached its softening temperature handling is not impeded by the increased temperature of the film, as a whole.

The choice of plastic material is made in dependence on the specific implementation of the invention, in particular in dependence on the desired melting or decomposition temperatures and the further use of the circuit board produced in accordance with the invention, in particular having regard to the stability thereof at typical soldering and reflow temperatures of up to 310° C. The melting or decomposition temperatures can be measured with per se known methods. In the case of the melting-in process the carrier used is preferably a thermosetting material with a decomposition point of over 360° C. or a thermoplastic material whose melting point is higher than 360° C., and a plastic material with a melting point of between approximately 300° C. and 320° C. is used as the melting-in layer. Particularly preferably the plastic material is an olefin, polymethylmethacrylate (PMMA) or polyetherketone (PEK), in particular polyetheretherketone (PEEK).

In a preferred process heating of the granular material is combined with an application of pressure. For that purpose the procedure preferably involves rolling over with a roller. That roller is preferably at a temperature which is selected to be so high that the granular material fuses and/or can penetrate into the substrate. Optionally it is also possible to provide for the material to sink into the substrate. Rolling over the material with a roller makes use of the fact that the substrate, in particular the plastic material, softens due to the hot roller. The additional mechanical pressure applied to the granular material causes the granular material to be pressed into the substrate and there enters into an intimate bond with the substrate. In that case the conductivity of the circuit portion is still retained.

In accordance with a preferred embodiment of the invention the laser printing process is used for the production of the at least one circuit portion on the substrate. The granular material is preferably transferred out of a supply container (cartridge) onto the substrate and bound there, as is provided in the case of a laser printer for forming a print image with a toner. If the step of depositing the various granular materials is repeated in substeps the granular materials can be provided in separate supply containers as in the case of a color laser printer and successively applied to the substrate.

To use laser printing the process according to the invention includes in particular the charging step in which the granular material and the substrate are electrostatically charged up in opposite relationship relative to each other and the step of bringing the granular material and the substrate together so that the granular material is arranged along the desired geometrical distribution of the granular material, for example the desired conductor track structure on the substrate.

The geometrical distribution is impressed on the granular material or the substrate in the charging step. In the former case a light-sensitive roller is electrostatically charged. That roller is exposed by means of an LED or a laser in dependence on the desired geometrical distribution. The charge acts at the non-exposed locations so that the granular material is arranged in accordance with the registered image of the distribution. That granular material is then pulled from the roller onto the substrate by an opposite charge. In the second case the charge is transferred with the geometrical distribution from the exposed roller onto the substrate.

Preferably the step of charging the substrate includes electrostatic charging of an electrization element which includes an electrical photoconductor which is in contact with an electrical conducting element and then selective exposure of the electrization element so that the photoconductor becomes electrically conducting at the exposed locations and the electrostatic charge is removed by way of the contact with the electrical conductor. For that purpose the electrical conducting element is preferably grounded. After the selective exposure operation the electrostatic charge is transferred onto the substrate. That is effected for example by bringing the electrization element and the substrate into contact. That process is particularly suitable for inflexible substrates such as for example Pertinax plates or thermosetting substrates.

In an alternative embodiment of a process according to the invention the substrate is positioned on the electrization element prior to the electrostatically charged granular material and the electrostatically charged substrate being brought together. In that case the electrical charge is between the electrization element and the substrate. In that case, an electrical field occurs by virtue of polarization of the substrate, between the side of the substrate, that is remote from the electrization element, and the surroundings of the substrate. By virtue of that field, the electrostatically charged granular material is electrostatically attracted by the locations opposite the charged locations of the electrization element.

In accordance with a further embodiment of the invention the film serving as the substrate can include a photoconducting layer so that the substrate can be directly electrostatically charged and can be written by means of a LED or a laser.

In accordance with a further modification of the process of the invention prior to heating the granular material a cover film can be placed on the substrate with the granular material deposited thereon so that the granular material is between the substrate and the cover film. That embodiment is advantageous in particular in the production of complete circuits which include protection with the cover film. If the film has a carrier and a melting layer involving different softening temperatures, the cover film is preferably so selected that its softening temperature corresponds to that of the carrier. When the film composite is heated the melting layer softens first. The granular material is joined to the melting layer and the circuit portions formed are covered on the one hand by the carrier and on the other hand by the cover film.

After production of a substrate with at least on circuit portion, the process according to the invention can involve still further steps which preferably include equipping the substrate with components and/or processing the substrate such as for example edge or surface processing, applying contacting holes or fixing on an additional fixed carrier plate.

In accordance with a particularly advantageous variant of the invention moreover it is possible to connect a plurality of (at least two) substrates such as for example conductor track films with components to afford a composite component. Here the term "composite component" is used to denote a multilayer circuit board including at least two mutually superposed substrates each with at least one circuit portion. The composite component can additionally include a carrier plate. Furthermore the composite component, for completing its own operational capability, can be provided with predetermined electrical connections, for example solder and/or wire connections between the circuit portions on the various substrates. Depending on the circuits or circuit portions which are combined together, various circuitry functions can be embodied in the composite component with a high degree of flexibility.

Figure 2:
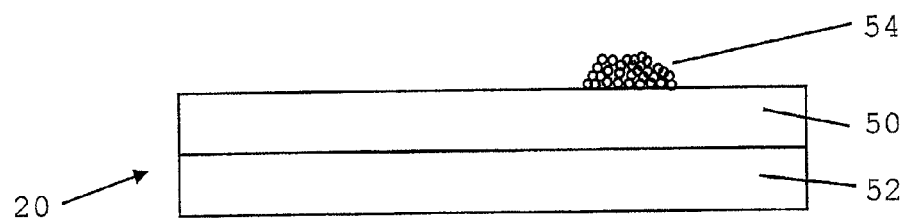
Figure 3:
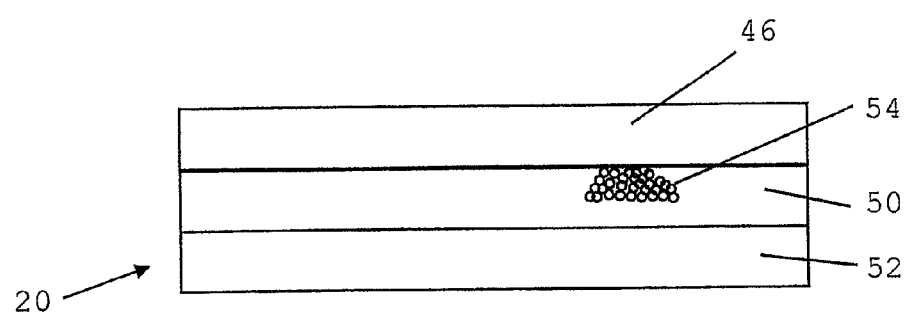

The invention is described hereinafter with reference to the accompanying drawings in which:

FIG. 1 shows an apparatus according to the invention for the production of circuit portions on a substrate, FIG. 2 shows a diagrammatic view in section of a film multilayer structure used in accordance with the invention, and FIG. 3 shows the film multilayer structure of FIG. 2 after covering with a cover film and after being rolled over with a hot roller, also as a diagrammatic view in section.

The invention is described hereinafter with reference to the use of the laser printing process in the production of circuit portions on a substrate. Details of the circuitry technology such as for example the choice of the shape and arrangement of the circuit portions are known per se from the conventional technology for the production of printed circuits and are therefore not described in greater detail here. Details of the actuation of the imaging unit of a laser printer for providing a given geometrical distribution of the granular material are also known from conventional laser printing technology and are therefore not described in greater detail here.

FIG. 1 shows a diagrammatic view of an apparatus 10 according to the invention for the production of circuit portions on a substrate. The apparatus 10 includes an electrization element in the form of a photoconductor drum 12 which includes an electrically conductive, grounded, cylindrical main body 14 and a photoconductor 16 applied to the main body 14. The photoconductor includes amorphous organic semiconductors, amorphous silicon or arsenic triselenide ($As_2Se_3$). The photoconductor drum 12 is mounted rotatably about the axis of the cylinder of the main body 14 (direction of rotation indicated by the arrow P). The apparatus 10 is arranged in a light-tight housing (not shown).

The apparatus 10 includes an application means 18 for applying an areal substrate in the form of a plastic film 20 to the photoconductor drum 12. In this case the application means 18 includes three rollers 22a, 22b and 22c arranged around the conductor drum 12 in such a way that the plastic film 20 is pressed against the surface of the photoconductor drum 12. In the direction of rotation of the photoconductor drum 12, upstream of the location at which the plastic film 20 meets the photoconductor drum 12, there is a charge corotron 24 which electrostatically charges the surface of the photoconductor drum 12 by a corona discharge.

Disposed downstream of the charge corotron 24 in the direction of rotation is a character generator 26 including a plurality of light emitting diodes (LEDs). The character generator 26 is connected to a control means 28 by way of an electric line 30. In operation the control means 28 actuates the character generator 26 to expose the photoconductor 16 on the photoconductor drum 12 in accordance with a circuit structure stored in the control means, for example a conductor track structure, in locally selective fashion, through a substrate which is transparent for the light of the character generator 26. In that way the photoconductor 16 becomes conducting and the electrical charge on the surface of the photoconductor drum 12 flows away through the grounded main body 14. If the substrate is not sufficiently transparent the character generator 26 is disposed in the direction of rotation upstream of the point at which the substrate meets the photoconductor drum. Therefore, downstream of the character generator 26 in the direction of rotation, there are electrical charges only between the photoconductor drum 12 and the plastic film 20 at the locations which have not been illuminated by the character generator 26. That charge distribution corresponds to the desired distribution of the granular material to be deposited on the substrate.

Disposed downstream of the character generator 26 in the direction of rotation is a potential sensor 32 serving to monitor the writing operation of the character generator. Disposed downstream of the potential sensor 32 in the direction of rotation is a granular material cartridge 34 including a granular material container 36 (supply container) and an application roller 38. Copper powder is contained in the granular material container 36.

Granular material 54 from the granular material container 36 is applied in a uniform thin layer to the application roller 38 and there electrostatically charged. The electrostatic attraction force between the locations on which electrical charges are to be found on the photoconductor drum 12 and grains of the granular material 54, that are charged at opposite polarity, provides that the grains are accelerated towards the corresponding locations on the photoconductor drum and there adhere to the plastic film 20. As a result granular material 54 of a conductive material is deposited on a non-conductor which can be softened by heat, as a substrate, in accordance with the desired geometrical distribution (for example conductor track structure or structure of a component). The electrical charge respectively applied by the charge corotron 24 and the application roller 38 is so selected that the surface coverage of the film 20 with the granular material 54 is above the percolation threshold. As a result the conductor track produced is conductive after the film 20 has passed through the apparatus 10.

To increase the adhesion of the grains of the granular material 54 a heating device 40 is disposed upstream of the granular material cartridge 34 in the direction of rotation. The device 40 heats the radially outwardly disposed region of the plastic film 20 in such a way that it softens and thus affords better adhesion in relation to the copper grains of the granular material 54.

In an alternative embodiment the tendency to adhesion of the adhesive film 20 is increased by applying a thin film of an oil or an organic solvent.

Disposed downstream of the granular material cartridge 34 in the direction of rotation is a removal device 42 which removes the plastic film 20 from the photoconductor drum 12 and passes it away therefrom. Optionally, a cover film 47 can be conveyed onto the plastic film 20 by way of a feed means 44 including three feed rollers 46a, 46b and 46c, and positioned on the plastic film. Disposed downstream of the feed means 44 are two heating rollers 48a and 48b which heat the plastic film 20 and the cover film 47 to such an extent that the two are fixedly connected together and enclose the granular material 54 between them.

The granular material 54 is so heated by the heating rollers 48a, 48b that it enters into a permanent bond to the plastic film 20 and forms an electrically conductive conductor track.

A further alternative process provides that, instead of a copper granular material, it uses a granular material comprising a low-melting alloy having a melting point of below 200° C., in particular below 150° C., more particularly below 130° C. Heating of the heating rollers causes that granular material to melt and it forms a continuous conductor track.

FIG. 2 shows the multilayer structure of the plastic film 20. The plastic film 20 includes a first plastic film 50 as a melting-in layer and a second plastic film 52 as the carrier. Both plastic films comprise thermoplastic materials. The first plastic film 50 comprises polyethylene while the second plastic film 52 comprises polymethylmethacrylate (PMME). FIG. 2 shows the condition downstream of the granular material cartridge 34 and upstream of the feed means 44. Granular material 54 comprising copper grains adheres to the surface of the first plastic film 50.

An alternative process involves using polyetherketone (abbreviated to PEK), in particular polyetheretherketone (PEEK) as the second plastic film.

FIG. 3 shows a composite comprising the plastic film 20 and the optionally provided cover film 47 after the heating rollers 48a, 48b have been passed. By virtue of the heating operation which has taken place in the meantime the granular material 54 has sunk into the first plastic film 50 and there forms a conductor track.

The process can be carried out a plurality of times. In a further developed process the conductor tracks produced in that case on the corresponding substrates are placed one upon the other to form a stack so that a plurality of layers are produced on substrates. The conductor tracks on the respective substrates of the layers are then electrically conductingly connected together at the provided locations by virtue of the superposed relationship, that is to say by virtue of the physical contact involved. It is possible to produce integrated components in that way so that subsequent fitment of components can be eliminated.

In addition, by virtue of superpositioning of a plurality of layers, it is possible to form electrical components which extend in a direction which does not correspond to the extent of the substrate. Thus it is possible for two electrical conductor tracks which are enlarged to afford a structure in plate form to be separated by a layer of substrate so that the result is a capacitor.

Resistors can be produced by a specifically targeted choice of the surface coverage of the granular material. The smaller the surface coverage is selected to be, the correspondingly higher is the electrical resistance. In that case, that surface coverage which corresponds to the desired resistance is ascertained by a variation in the surface coverage.

In a process according to the invention it is also possible for granular materials of different electrical conductors or semiconductors to be successively applied. To form a diode or a transistor, granular materials of differently doped semiconductors are used, such as for example p- and n-doped silicon.

The invention claimed is:
1. A laser printing process for the production of at least one circuit portion on a substrate made from a plastic material, said process comprising the following steps:
  (a) depositing at least one granular material on a melting-in layer of said substrate so that said at least one granular material is distributed on said melting-in layer according a predetermined geometrical pattern, said at least one granular material including an electrically conducting material;
  (b) using as the substrate a film multilayer structure having a first plastic film which forms said melting-in layer and a second plastic film which form a carrier, wherein the first plastic film has a lower softening temperature than the second plastic film; and
  (c) heating the multilayer structure with the deposited granular material to the softening temperature of the melting-in layer so that the granular material enters into an intimate bond with the melting-in layer and, by adhering thereto, forms the at least one circuit portion on the substrate.

2. A process as set forth in claim 1 wherein the geometrical distribution of the at least one granular material is so selected that the circuit portion on the substrate forms at least one conductor track.

3. A process as set forth in claim 1 wherein the geometrical distribution of the at least one granular material is so selected that the circuit portion on the substrate forms at least one active or passive component.

4. A process as set forth in claim 1 wherein step (a) is repeated with various granular materials whose distributions are so selected that the circuit portion on the substrate forms an electrical circuit with at least one conductor track and at least one active or passive component.

5. A process as set forth in claim 1 wherein the plastic material includes an olefin or polymethylmethacrylate (PMMA).

6. A process as set forth in claim 1 further comprising a step of heating the at least one granular material to a temperature at which the granular material predominantly sinks into the substrate and/or provides a connection to the surface of the substrate.

7. A process as set forth in claim 1 wherein the step of depositing the at least one granular material includes the steps:
electrostatically charging the at least one granular material,
electrostatically charging the substrate in a subregion which corresponds to the predetermined geometrical distribution, and
bringing together electrostatically charged granular material and electrostatically charged substrate so that the granular material is arranged on the substrate in accordance with the predetermined geometrical distribution.

8. A process as set forth in claim 5 wherein the substrate charging step includes:
electrostatically charging an electrization element which includes an electrical photoconductor which is in contact with an electrical conducting element,
selectively exposing the electrization element so that at the exposed locations the photoconductors becomes electrically conducting and the electrostatic charge is removed by way of the contact with the electrical conducting element, and
transferring the electrostatic charge from the electrization element onto the substrate.

9. A process as set forth in claim 1 wherein prior to step (b) there is the following additional step:
placing a cover film on the substrate with the granular material deposited thereon so that the granular material is between the substrate and the cover film.

10. A process as set forth in claim 1 wherein prior to step (a) the following additional step is provided:
heating the substrate to a temperature at which the granular material adheres to the substrate inherently and without electrostatic charging.

11. A process as set forth in claim 1 further comprising a step of:
equipping the substrate with further components.

* * * * *